United States Patent [19]

Ochiai et al.

[11] Patent Number: 5,643,831

[45] Date of Patent: Jul. 1, 1997

[54] PROCESS FOR FORMING SOLDER BALLS ON A PLATE HAVING APERTURES USING SOLDER PASTE AND TRANSFERRING THE SOLDER BALLS TO SEMICONDUCTOR DEVICE

[75] Inventors: Masayuki Ochiai; Hidefumi Ueda; Michio Sono; Ichiro Yamaguchi; Kazuhiko Mitobe; Koki Otake; Junichi Kasai; Nobuo Kamehara; Yasuo Yamagishi; Masataka Mizukoshi; Yutaka Yamada; Susumu Abe, all of Kawasaki, Japan

[73] Assignee: Fujitsu Limited, Kawasaki, Japan

[21] Appl. No.: 547,532

[22] Filed: Oct. 24, 1995

Related U.S. Application Data

[63] Continuation-in-part of Ser. No. 374,429, Jan. 19, 1995, abandoned.

[30] Foreign Application Priority Data

Jan. 20, 1994 [JP] Japan ................. 6-004751

[51] Int. Cl.$^6$ .................. H01L 21/283; H01L 21/48; H01L 21/60
[52] U.S. Cl. .................. 437/183; 437/228 BO; 228/254; 228/180.22; 228/248.1
[58] Field of Search .................. 228/254, 180, 228/22, 248.1, 248.5; 437/183, 228 SE, 228 BO, 228 W

[56] References Cited

U.S. PATENT DOCUMENTS

| | | | |
|---|---|---|---|
| 3,458,925 | 8/1969 | Napier et al. | 228/180.22 |
| 5,135,606 | 8/1992 | Kato et al. | 156/631 |
| 5,136,363 | 8/1992 | Endo et al. | 257/781 |
| 5,145,552 | 9/1992 | Yoshizawa et al. | 156/638 |
| 5,208,186 | 5/1993 | Mathew | 228/180.22 |
| 5,381,848 | 1/1995 | Trabucco | 228/254 |

FOREIGN PATENT DOCUMENTS

| | | |
|---|---|---|
| 242908 | 2/1987 | Germany. |
| 53-3980 | 2/1978 | Japan. |
| 62-25435 | 2/1987 | Japan. |
| 63-289824 | 11/1988 | Japan. |
| 1-308037 | 12/1989 | Japan. |
| 4-14834 | 1/1992 | Japan. |
| 4-263433 | 9/1992 | Japan. |
| 4-263434 | 9/1992 | Japan. |
| 4-264731 | 9/1992 | Japan. |
| 6-124953 | 5/1994 | Japan. |

Primary Examiner—David E. Graybill
Attorney, Agent, or Firm—Armstrong, Westerman, Hattori, McLeland & Naughton

[57] ABSTRACT

A method for fabricating a semiconductor device using a solder ball forming plate having cavities. The plate is made from a silicon plate having a flat surface in a <110> crystallographic plane, and an orientation flat in a <1-11> crystallographic plane. The cavities are formed on the flat surface of the plate by etching, using a mask having openings in the shape of rhombus arranged such that one side of the rhombus is generally parallel to the <1-11> crystallographic plane. As a result, the cavities having wedge-shaped bottom are formed. The cavities are then filled with a solder paste and are heated to form solder balls in the cavities while the plate in an inclined position. The solder balls are then transferred from the plate to a semiconductor chip.

13 Claims, 9 Drawing Sheets

PROCESS FOR FORMING SOLDER BALLS ON A PLATE HAVING APERTURES USING SOLDER PASTE AND TRANSFERRING THE SOLDER BALLS TO SEMICONDUCTOR DEVICE

CROSS REFERENCE TO RELATED APPLICATION

This application is a Continuation-In-Part application of Ser. No. 08/374,429 filed on Jan. 19, 1995 abandoned.

BACKGROUND OF THE INVENTION

1. Field of the Invention

The present invention relates to a method for fabricating a semiconductor device, and in particular, to a method for efficiently fabricating solder bumps on, for example, electrode pads of a semiconductor chip. In particular, the present invention relates to a method for fabricating solder bumps by forming solder balls from a solder paste.

2. Description of the Related Art

Recent data processing apparatuses include many LSIs and VLSIs for dealing with a large volume of data at a very high speed. LSIs and VLSIs comprise semiconductor chips which include integrated electronic circuits and parts. In order to mount a semiconductor chip to, for example, a ceramic substrate, solder bumps are arranged onto one of the semiconductor chip and the ceramic substrate so that the semiconductor chip can be mechanically and electrically connected to the ceramic substrate by melting the solder bumps.

Conventionally, a solder paste is printed onto the ceramic substrate, and leads extending from the semiconductor chip are placed on the solder paste on the ceramic substrate. The ceramic substrate is then heated to cause the solder to melt so that the semiconductor chip can be mechanically and electrically connected to the ceramic substrate (For example, Japanese Examined Patent Publication (Kokoku) No. 53-3980). For printing the solder paste onto the ceramic substrate, a metal mask having predetermined openings is used, so that the solder paste is applied to the surface of the metal mask and a squeegee is moved along the surface of the metal mask to cause the solder paste pass through the openings in the metal mask.

Japanese Unexamined Patent Publication (Kokai) No. 6-124953 discloses a method for forming solder bumps with the use of a plate having a plurality of cavities. In this method, the cavities are filled with solder paste, and a semiconductor device having gold bumps is moved toward this plate so that the gold bumps are stuck in the solder paste in the cavities. The semiconductor device is then moved away from this plate, and the solder bumps in the form of solder paste are attached to the gold bumps of the semiconductor device.

However, as the electronic circuits on the semiconductor chip are highly integrated, the number of the leads acting as input and output terminals increases and the pitch between the leads is shortened. In this situation, the amount of the solder paste to be printed becomes smaller and the printing of the solder paste becomes difficult. That is, the solder paste comprises solder powder usually having the powder size of 30 to 50 μm and a flux including a resin, an activator, and an organic solvent, and the viscosity of the solder paste at the room temperature is relatively high, for example, in the order of 20 to 30×10$^4$ cp. Therefore, if the size of the openings of the metal mask is small, for example 100 μm, the solder paste may clog the openings of the metal mask and may not pass smoothly through the openings of the metal mask, with the result that the solder paste is not printed onto the ceramic substrate.

In the recently introduced flip-chip structure, leads are not attached to the semiconductor chip, but solder bumps are arranged on the semiconductor chip so that the semiconductor chip can be directly mounted on the ceramic substrate. In this case too, as the size of the solder bumps has become smaller, the printing of the solder bumps has become difficult. Thus, methods for fabricating smaller solder bumps, which do not use a solder paste but use solder only, have been proposed. One is a vacuum vapor deposition method, and the other is a solder plating method.

A vacuum vapor deposition method is disclosed in, for example, Japanese Unexamined Patent Publication (Kokai) No. 4-014834. The solder is heated and vaporized in a vacuum environment, and the vaporized solder is deposited on an object. In the method disclosed in the above publication, a transfer plate made from a material such as quartz or glass having a good heat resisting property and a low wettability to the solder, and a metal mask having openings in a predetermined pattern are used. The transfer plate is placed above the metal mask so that the solder vapor which passes through the openings of the metal mask is deposited onto the transfer plate. Therefore, solder bumps are formed onto the transfer plate in the same pattern as that of the openings of the metal mask.

The heated semiconductor chip is then superposed on the transfer plate so that the solder bumps are transferred from the transfer plate to the semiconductor chip. In this way, solder bumps are formed on the semiconductor chip in the predetermined pattern. By this method, it is possible to form solder bumps with a high accuracy, but there is a problem that a long time is necessary for vaporizing the solder and forming solder bumps having a desired thickness, for example, several tens of μm.

In the solder plating method, the semiconductor chip is subjected to plating after the surface of the semiconductor chip is covered by a resist and openings are formed in the resist at positions where solder bumps are to be formed. In this method, however, the circuits in the LSI, for example, are affected by the plating solution and undergo a chemical change, resulting in a deterioration of the electrical characteristic or an undesirable composition change in the deposited solder.

In addition, the solder bumps are formed not only on the semiconductor chip but also on other members such as a ceramic substrate or a ceramic package. Also, solder bodies in the form of balls without solder paste are available for certain applications. It is possible to form solder bumps using these solder balls. However, there is no prior art by which the solder balls can be easily fabricated with a very small variation in size.

SUMMARY OF THE INVENTION

The object of the present invention is to provide a method for easily fabricating a semiconductor device having solder bumps having a desired size.

According to the present invention, there is provided a method for fabricating a semiconductor device. The method comprises the steps of: preparing a plate having a flat surface, a <110> crystallographic plane, and a <1-11> crystallographic plane, said flat surface being in the <110> crystallographic plane; forming a plurality of cavities on the flat surface of the plate by etching, using a mask having apertures in the shape of a parallelogram arranged such that one side of the parallelogram is generally parallel to the <1-11> crystallographic plane; filling the cavities with a solder paste; heating the plate to form solder balls in the cavities; and transferring the solder balls from the plate to a first member onto which solder bumps are to be formed. Preferably, the plate comprises a silicon plate.

By forming the cavities according to the above defined method, the cavities are etched along the crystallographic plane in a well controlled manner, and the cavities are uniformly formed in the shape of a wedge in cross section. It is possible to obtain very small and uniform cavities with well-controlled sizes and depths. There is an established technique for the treatment of silicon plates for the fabrication of semiconductor chips, and the cavities can be easily formed on the plate using the established technique if the plate comprises a silicon plate. In addition, the silicon plate has a good sliding property when a squeegee makes a sliding contact with the plate when the cavities are filled with a solder paste.

Preferably, the plate is covered by a protective layer, which preferably comprises an oxide layer or a nitride layer. The protective layer serves to bring the plate into a chemically stable condition and provides a low wetability to the plate, so a durability of the plate is improved and the formed solder balls can be easily transferred.

Preferably, etching is carried out by dry etching. In this case, several mask are used in the etching to form cavities. It is also possible to carry out etching by anisotropic etching.

In a further aspect of the present invention, there is provided a method for fabricating a semiconductor device, the method comprising the steps of: preparing a plate having a flat surface; forming a plurality of cavities on the flat surface of the plate; filling the cavities with a solder paste; heating the plate to form solder balls in the cavities while the plate is arranged in an inclined position relative to a horizontal; and transferring the solder balls from the plate to a first member onto which solder bumps are to be formed. By heating the plate in an inclined position, the formed solder balls flow to the lower, predetermined positions in the cavities, and the solder balls are identically positioned in those predetermined positions. This feature can be applied to the above described feature of the invention.

In a further aspect of the present invention, there is provided a method for fabricating a semiconductor device, the method comprising the steps of: preparing a plate having a flat surface; forming a plurality of cavities on the flat surface of the plate; providing a nucleus material for forming a solder ball at a position in each of the cavities; filling the cavities with a solder paste; heating the plate to form solder balls in the cavities; and transferring the solder balls from the plate to a first member onto which solder bumps are to be formed. In this case, the solder balls are formed at predetermined positions determined by the nucleus materials, and the solder balls are identically positioned in the predetermined positions. This feature can be applied to the above described feature of the invention.

BRIEF DESCRIPTION OF THE DRAWINGS

The other objects and features of the present invention will become more apparent from the following description of the preferred embodiments, with reference to the accompanying drawings in which.

SUMMARY OF THE INVENTION

The object of the present invention is to provide a method for easily fabricating solder bumps having a desired size.

The other object of the present invention is to provide a method for fabricating solder balls by which solder balls having a desired size can be easily fabricated.

DESCRIPTION OF THE PREFERRED EMBODIMENTS

Figure 1A:
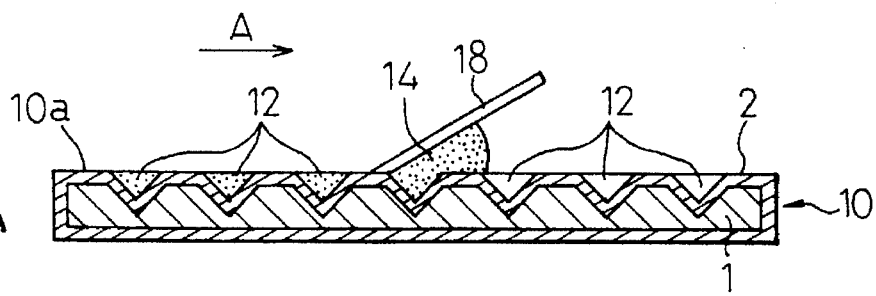
FIGS. 1A to 1E are views illustrating a method for fabricating a semiconductor device according to the first embodiment of the present invention.

FIGS. 1A to 1E are views illustrating a method for fabricating a semiconductor device having solder bumps according to the first embodiment of the present invention. In the method of the present invention, a solder ball forming plate 10 is first prepared, as shown in FIG. 1A. The solder ball forming plate 10 has a flat surface 10a and a plurality of identically shaped cavities 12 arranged on the flat surface 10a in a pattern corresponding to the pattern of solder bumps that is to be formed.

Figure 2:
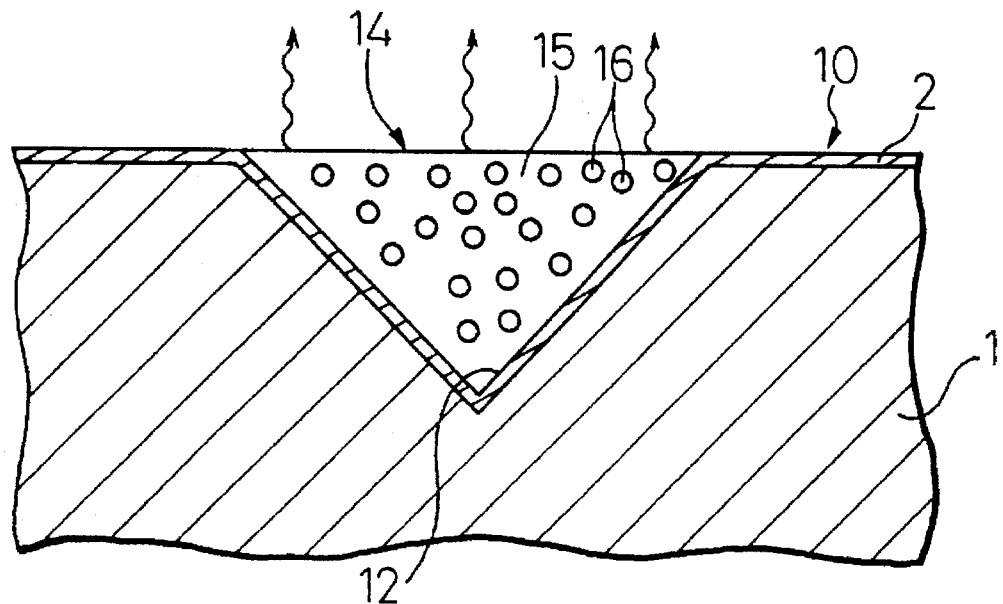
FIG. 2 is a cross-sectional view of the solder ball forming plate after the cavities are filled with a solder paste.
Figure 5:
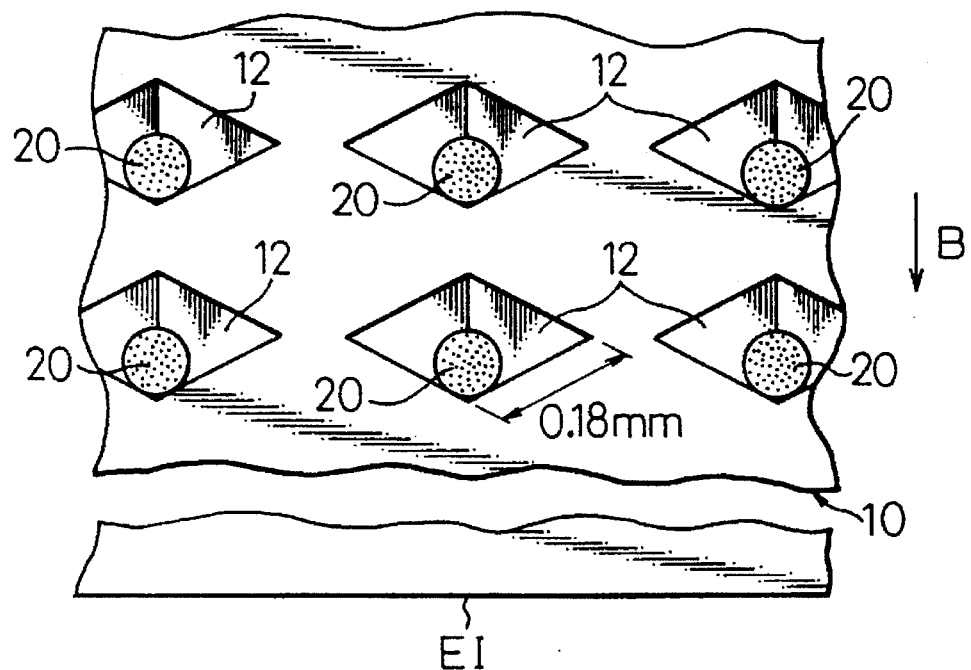
FIG. 5 is a plan view of the solder ball forming plate of FIG. 4.

The solder ball forming plate 10 comprises a silicon plate 1 and a protective layer 2 such as a nitride layer or an oxide layer. The cavities 12 are formed in the shape of a parallelogram, in particular, a rhombus, viewed from above, as shown in FIG. 5. The cavities 12 are formed in the shape of a wedge in cross section, as shown in FIG. 2. The formation of the cavities 12 is described later.

The cavities 12 of the solder ball forming plate 10 are then filled with a solder paste 14, by moving a squeegee 18 along the flat surface 10a of the solder ball forming plate 10 in the direction of the arrow A, for example, as shown in FIG. 1A. The solder paste 14 comprises solder grains 16 and a flux 15 (see FIG. 2). The flux 15 includes a resin, an active agent, and an organic solvent. Solder grains 16 are uniformly distributed in the solder paste 14, and the volumes of the solder grains 16 in the cavities 12 are substantially the same.

Figure 1B:
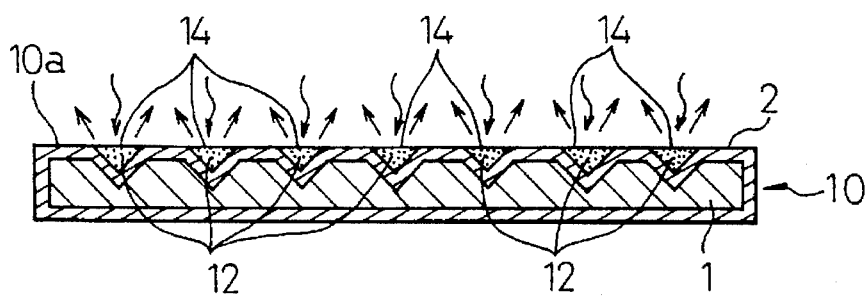
Figure 1C:
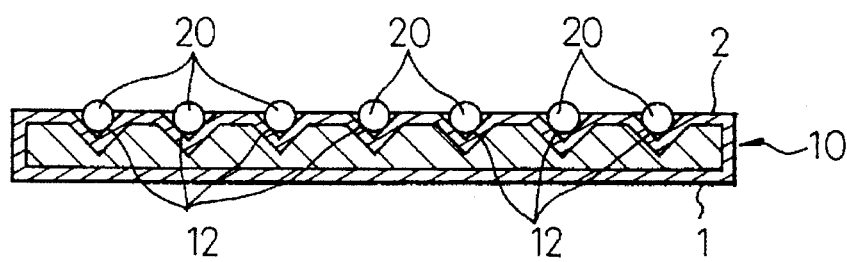
Figure 4:
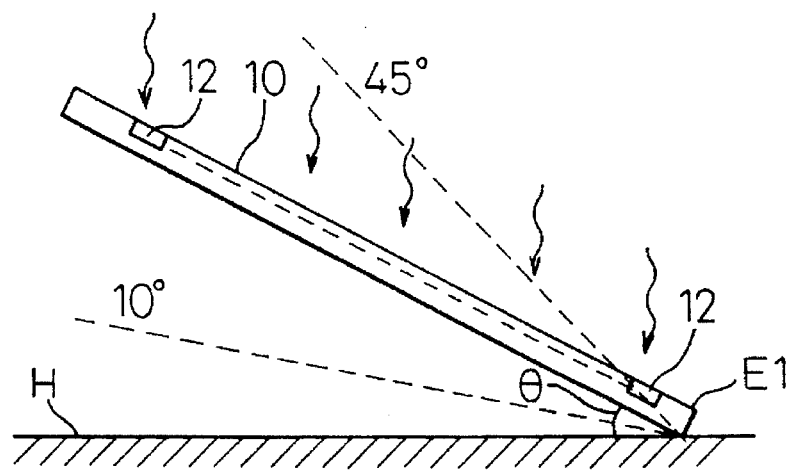
FIG. 4 is a side view of the solder ball forming plate arranged in an inclined position.

The solder ball forming plate 10 is then heated to a temperature (for example, 320° to 400° C.) higher than the melting point of the solder (for example, 300° to 314° C.), as shown in FIG. 1B. Heating is carried out while the solder ball forming plate 12 is arranged in an inclined position relative to a horizontal H by an angle θ in the range from 10 to 45 degrees, as shown in FIGS. 4 and 5. The solder grains 16 contained in the solder paste 14 are thus molten and flow together due to surface tension. Accordingly, a solder ball 20 is formed in each of the cavities 12, as shown in FIG. 1C. A part of the resin and the active agent in the flux 15 may partially evaporate or be decomposed, and the other part may remain in the cavities 12.

Figure 3:
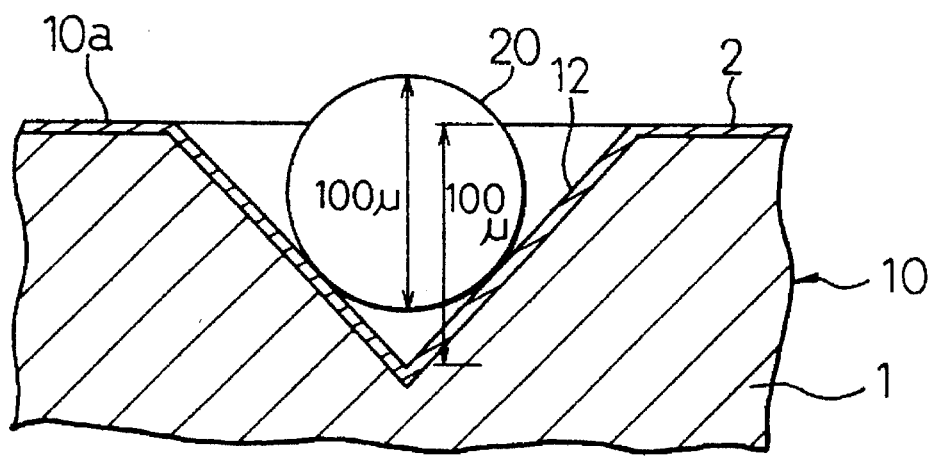
FIG. 3 is a cross-sectional view of the solder ball forming plate after the plate is heated and the solder balls are formed.

When one side of the rhombus forming the cavities 12 is 0.18 mm (FIG. 5), and the depth of the cavities 12 is 100 μm, the diameter of the formed solder ball 20 is approximately 100 μm, as shown in FIG. 3. The solder ball 20 is formed on the wedge shaped bottom such that the solder ball 20 sufficiently projects from the flat surface 10a of the solder ball forming plate 10. Since the solder ball 20 is inclined during heating, the solder balls 20 are formed on the lower point (indicated by the arrow B) in the wedge shaped bottom of the cavities 12, as shown in FIGS. 4 and 5. Therefore, the solder balls 20 are formed in the identical positions in the cavities 12, even when the latter are larger than the diameter of the solder balls 20.

Figure 1D:
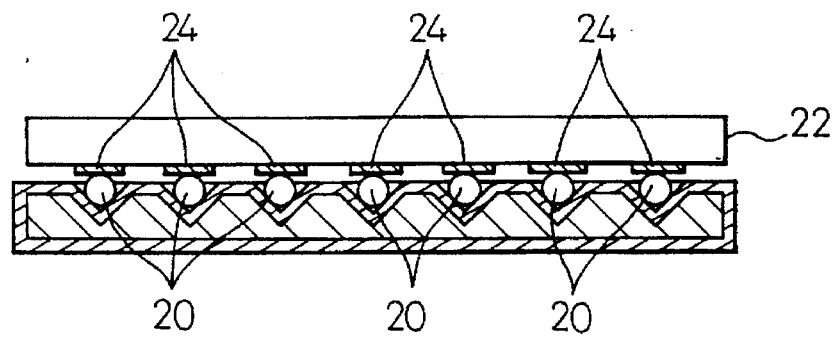
Figure 1E:
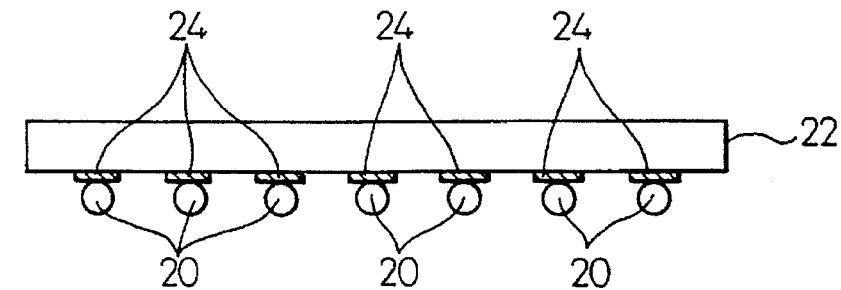

A first member 22 onto which solder bumps are to be formed is then moved toward the solder ball forming plate 10, so that the first member 22 abuts against the heated solder balls 20 and the heated solder balls 20 are transferred from the solder ball forming plate 10 to the first member 22, as shown in FIG. 1D. The solder balls 20 become solder bumps 20 after being cooled, as shown in FIG. 1E. The first member 22 onto which solder bumps are to be formed comprises a semiconductor chip in the form of an LSI or a VLSI and has electrode pads 24 connected to the circuits (not shown). The cavities 12 of the solder ball forming plate 10 are arranged in the same pattern as the electrode pads 24 of the first member 22. The first member 22 may be one other than the semiconductor chip, for example, a semiconductor package called a pin grid array (PGA), a semiconductor package called a ball grid array (BGA), a semiconductor package called a multi chip module (MCM), a semiconductor package called a quad flat package (QFP), a printed wiring board (PWB), or TAB member, or a part of these components.

Figure 6:
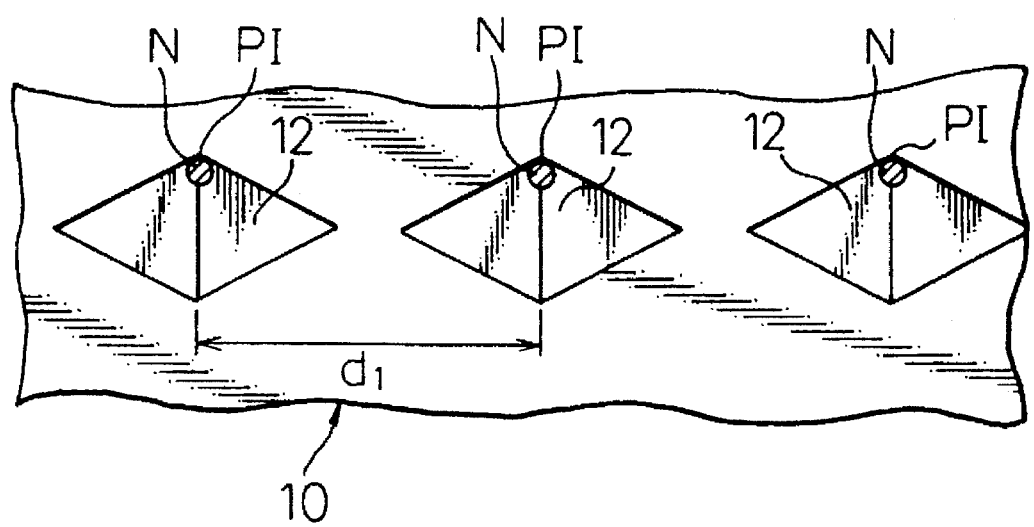
FIG. 6 is a plan view of the solder ball forming plate according to the second embodiment of the present invention.
Figure 7:
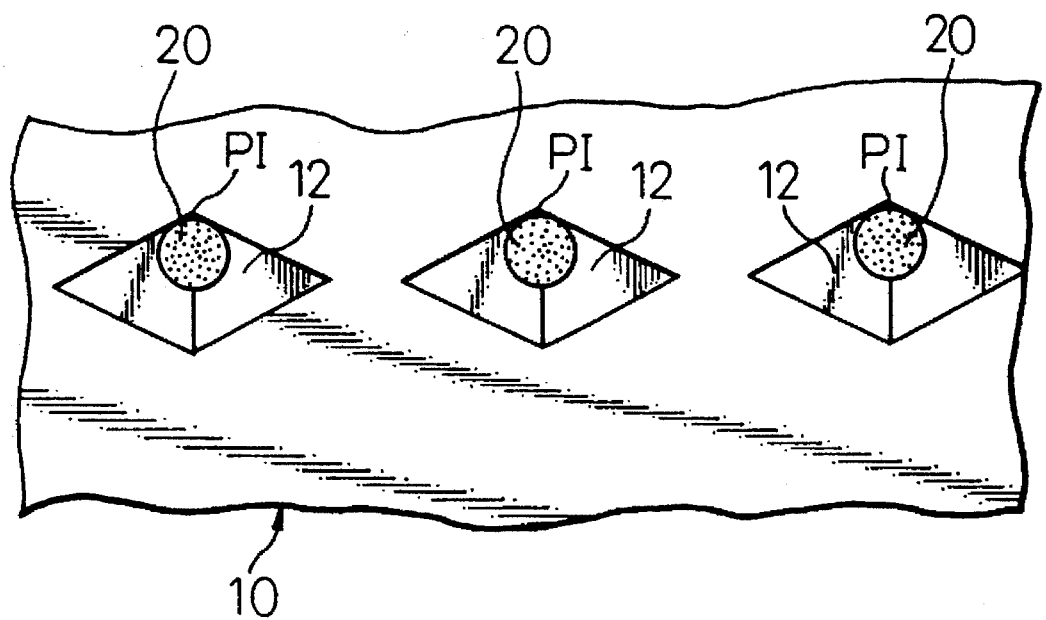
FIG. 7 is a plan view of the solder ball forming plate of FIG. 6 after the solder balls are formed.

FIGS. 6 and 7 show a modified example of the present invention. A nucleus material N for forming a solder ball at a predetermined position is provided in each of the cavities 12 at one corner PI thereof, before the solder ball forming plate 10 is heated, as shown in FIG. 6. The solder ball forming plate 10 is then heated to form the solder balls 20 near the nucleus materials N, as shown in FIG. 7. The solder ball forming plate 10 is heated in the horizontal position in this example, although the solder ball forming plate 10 is heated in the inclined position in the previous example. In this case too, the solder balls 20 are formed in the identical positions in the cavities 12. The steps shown in FIGS. 6 and 7 correspond to steps shown in 1A to 1C, and it will be understood that steps similar to steps shown in 1D to 1E can follow the steps shown in FIGS. 6 and 7.

By way of an example of the nucleus material N, a flux is applied to the cavities 12. For example, hollow needles are used to apply the flux such that the hollow needles are arranged at a pitch corresponding to the pitch $d_1$ of the cavities 12 and the flux is injected in the cavities after the free ends of the hollow needles are inserted into the cavities 12 at the corners PI, respectively. It is also possible to use other materials for the nucleus material N. For example, solid particles of a solder having a low melting point, solid particles of a conductive resin, or solid particles such as magnetic particles of ferrite can be used. These solid particles can be adequately positioned in the cavities 12, by bringing the solder ball forming plate 10 in an inclined position after the solid particles are admitted into the cavities 12.

FIGS. 8A to 8H shows a process for preparing the solder ball forming plate 10 of FIGS. 1A to 1E. FIG. 9 shows a silicon wafer 100 used in this process, and FIG. 10 shows a mask 4 also used in this process.

Figure 8A:
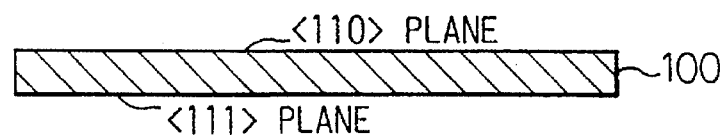
FIGS. 8A to 8H are views illustrating a process for preparing the solder ball forming plate of FIGS. 1A to 1E.
Figure 8B:
Figure 8C:
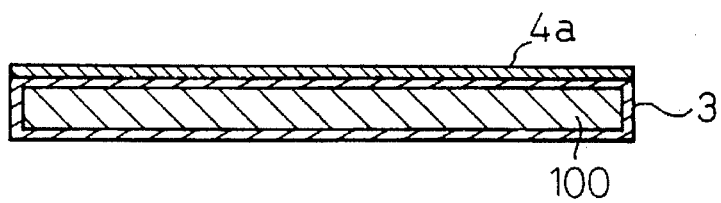
Figure 8D:
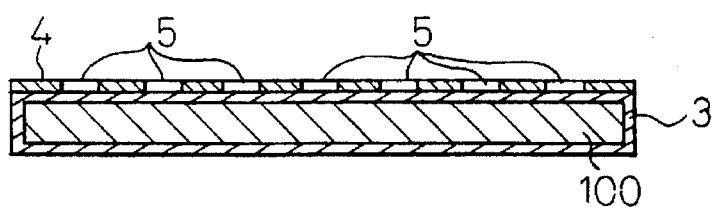
Figure 8E:
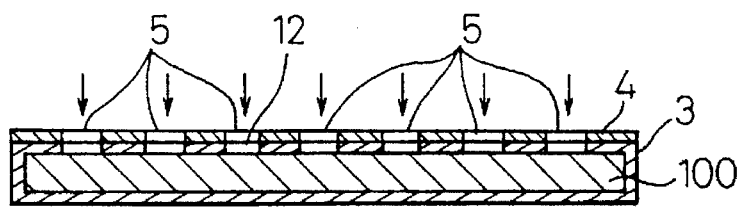
Figure 9:
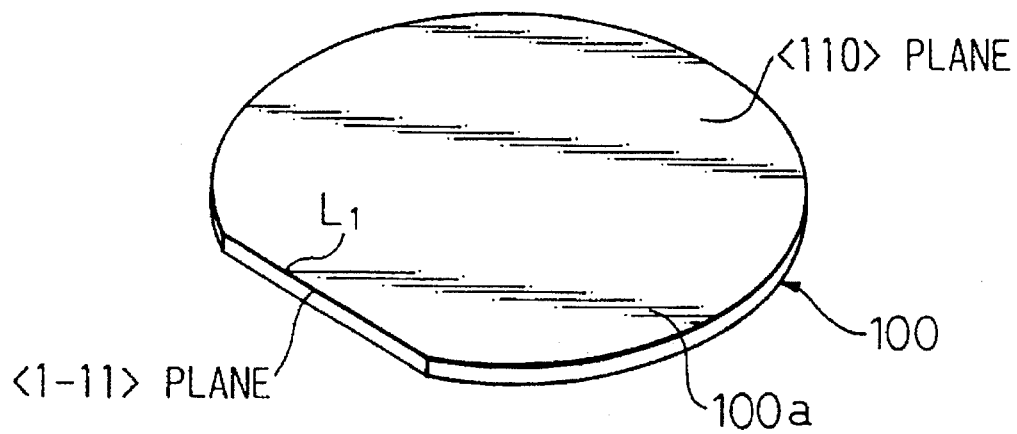
FIG. 9 is a perspective view of a silicon wafer for preparing the solder ball forming plate.
Figure 10:
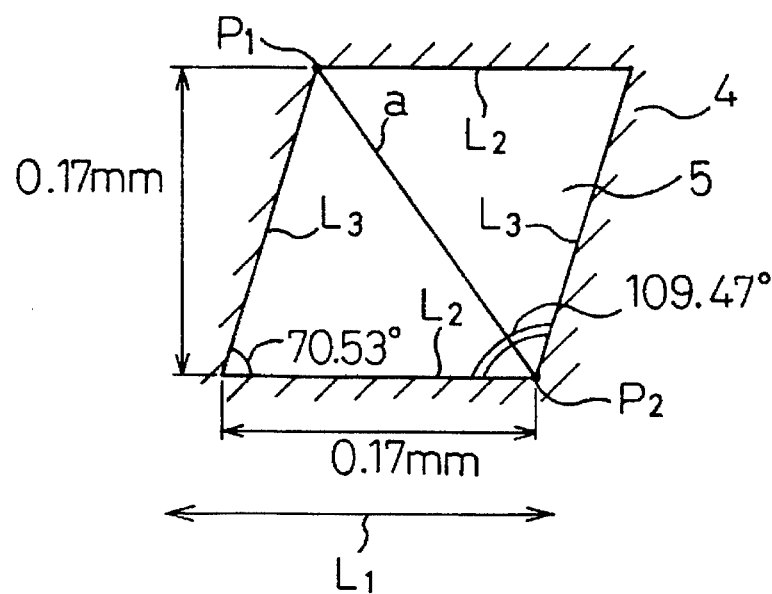
FIG. 10 is a view illustrating a mask used for preparing the solder ball forming plate of FIGS. 1A to 1E.

A silicon wafer 100 has a flat surface 100a and an orientation flat $L_1$, as shown in FIGS. 8A and 9. The silicon wafer 100 is cut so that the flat surface 100a is in a <110> crystallographic plane, and the orientation flat $L_1$ is in a <1-11> crystallographic plane. A protective layer 3 such as a nitride layer (SiN) or an oxide layer (SiO$_2$) is formed on the surface of the silicon wafer 100, as shown in FIG. 8B. A resist 4a is applied to the protective layer 3, as shown in FIG. 8C, and the resist 4a is patterned, by electronic beam exposure and by etching, to provide the mask 4 having apertures 5, as shown in FIG. 8D.

The apertures 5 of the mask 4 are formed in the shape of rhombus, having sides $L_2$ and $L_3$, arranged such that side $L_2$ of the rhombus is generally parallel to the <1-11> crystallographic plane, i.e., parallel to the orientation flat $L_1$ and the intersecting $L_2$ and $L_3$ sides together form an angle of 70.53 degrees. This arrangement allows the formation of the cavities 12 each having a mouth in the shape of a rhombus, and a wedge-shaped bottom, upon subsequent etching.

Figure 8F:
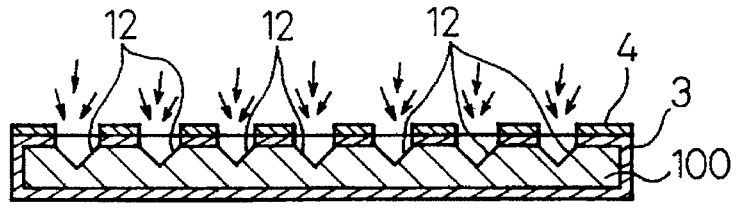

After the mask 4 is formed, dry etching is carried out, with the result that the protective layer 3 has apertures corresponding to the apertures 5 of the mask 4. Anisotropic etching is then carried out, using an etchant including potassium hydroxide (KOH) as a basic component, as shown in FIG. 8F. The anisotropic etching is carried out for one hour, with an etchant including potassium hydroxide of 30 percent by weight. The cavities 12 each having a mouth in the shape of a rhombus, and a wedge-shaped bottom, are formed on the silicon wafer 100. The resultant cavities 12 are shown in FIGS. 11 and 12.

Figure 8G:
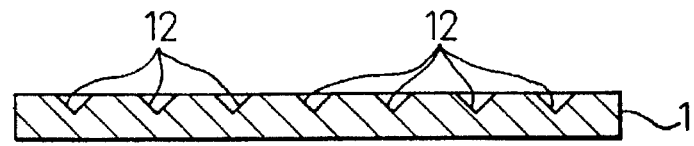
Figure 8H:
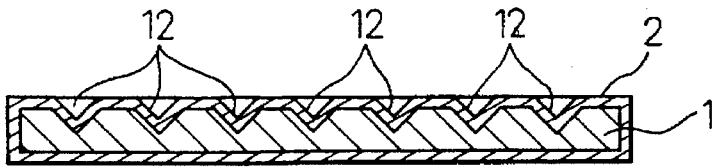

Plasma etching is then carried out to remove the mask 4, and the protective layer 3 is removed by phosphoric acid, with the result that the silicon plate 1, having the cavities 12, is formed as shown in FIG. 8G. The silicon plate 1 is then subjected to thermal oxidation to form the protective layer 2 on the silicon plate 1, as shown in FIG. 8H. The silicon plate 1 can then be cut to an appropriate size.

Figure 11:
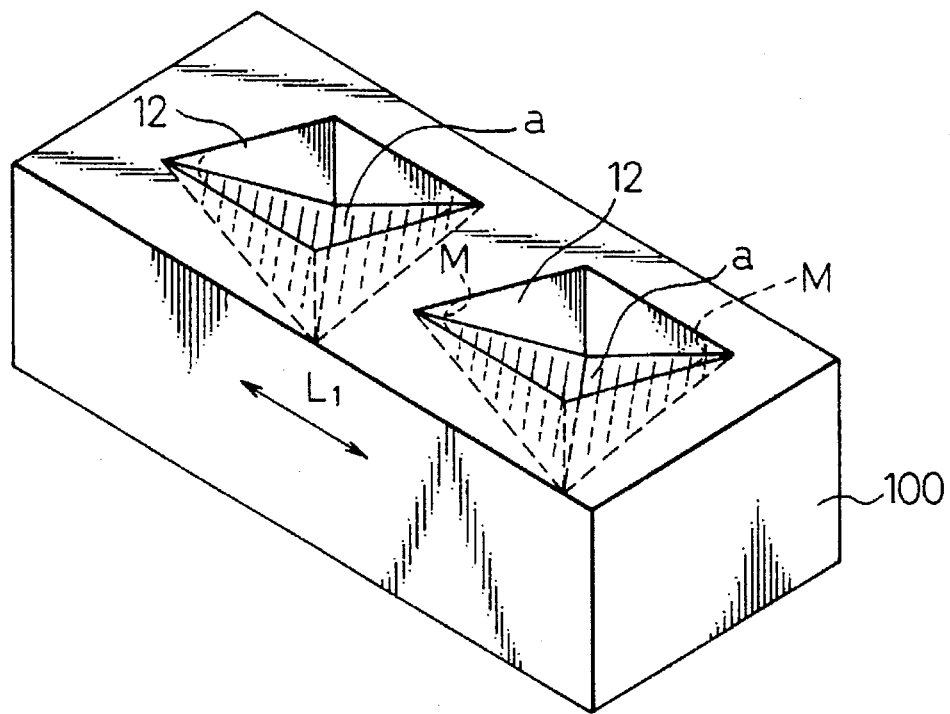
FIG. 11 is a diagrammatic perspective view of the solder ball forming plate, illustrating the shape of the cavities.
Figure 12:
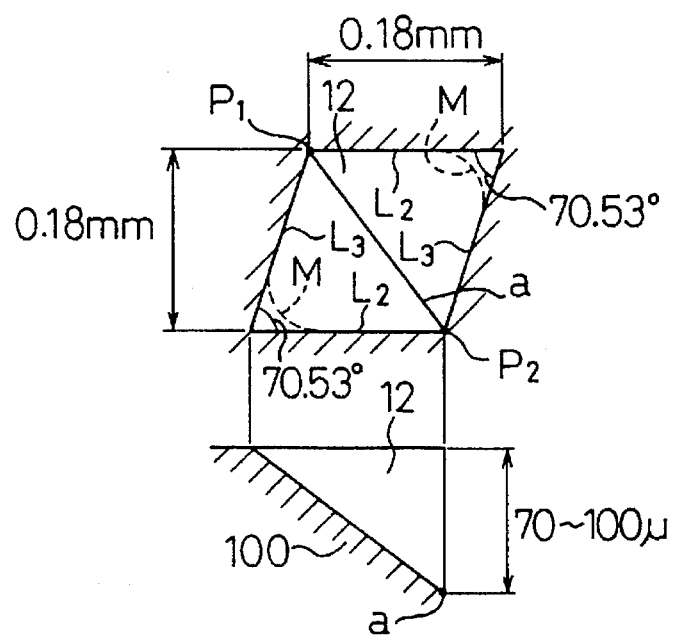
FIG. 12 is a diagrammatic view of the cavity of the solder ball forming plate.

In FIGS. 11 and 12, the silicon wafer 100 is etched, depending on the directions of crystal, so that the cavities 12 have wedge-shaped bottoms with the deepest part of the wedge-shaped bottom extending along a line "a" between the points $P_1$ and $P_2$. Due to underetching, the length of one side of the cavities 12 is 0.18 mm, although the length of one side of the aperture 5 of the mask 4 is 0.17 mm. However, etching does not proceed so much at the narrow-angled corners of the rhombi and the actually formed cavities 12 are deformed from exact rhombi to approximate hexagons, as shown by the broken line M. When etching is carried out for one hour, with potassium hydroxide of 30 percent by weight, the depth of the cavities 12 becomes 70 to 100 μm.

Figure 13:
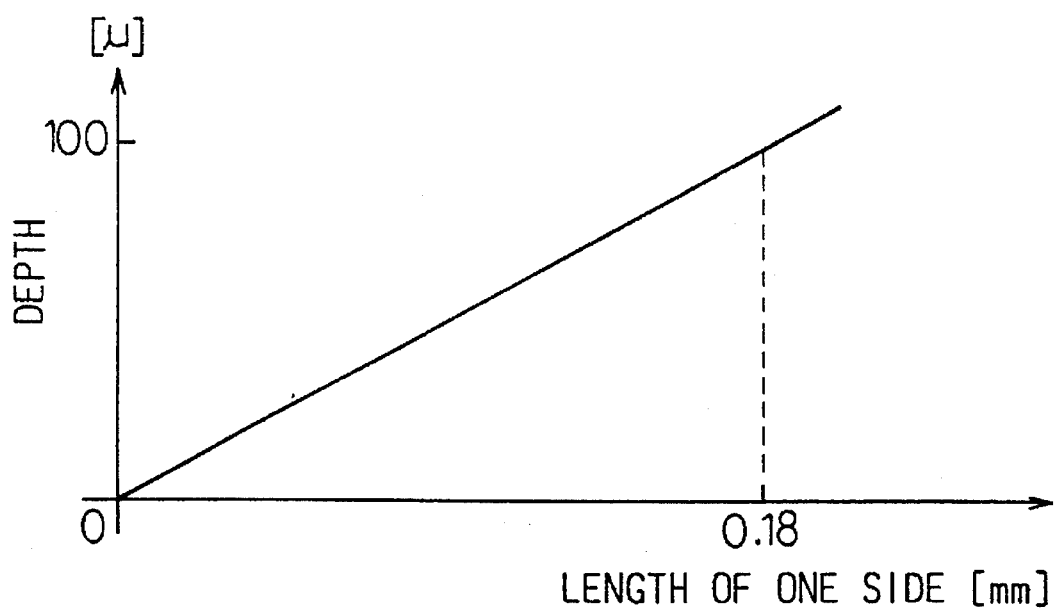
FIG. 13 is a view illustrating the relationship between the depth and the length of one side of the cavity.

FIG. 13 shows the relationship between the depth of the cavities 12 and the length of one side of the mouth of the cavities 12. It will be understood that the depth of the cavities 12 increases in direct proportion to the length of one side of the mouth of the cavities 12. The relationship between the shape of the cavities 12 and the size of the solder balls 20 can be obtained from the following equation, where "1" is the length of one side of the mouth of the cavities 12, α is an angle of inclination of the walls of the cavities 12, "h" is the depth of the cavities 12, and "r" is the radius of the solder balls 20. It is possible to obtain cavities having a similar shape to and greater than the cavities 12 shown in FIGS. 11 and 12, by increasing the length of one side of rhombi of the mask 4.

$$\frac{1}{2} \times \frac{1}{2} \times l^2 \times \sin\alpha \times 2 \times h = \frac{4}{3} \pi r^3$$

According to this process, it is possible to make use of the characteristics of crystalline silicon plate 11 to carry out etching of the cavities 12 in an exactly controlled manner, and to reduce a variation of the solder paste 14 filled in the cavities 12 to obtain solder balls 20 having uniform sizes. It is also possible to obtain the cavities 12 which are adapted for a fine pitch arrangement, utilizing micro-fabrication processes from the semiconductor industries.

Figure 14A:
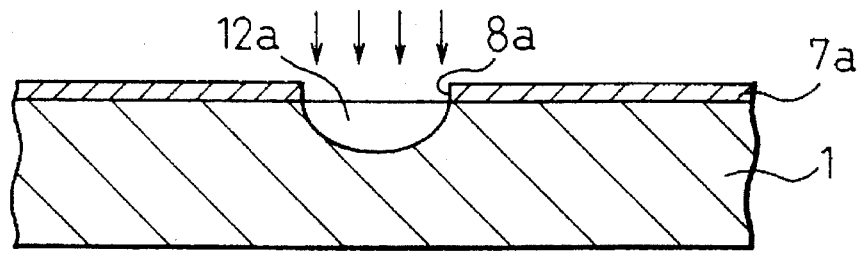
FIGS. 14A to 14C are views of the second embodiment of the present invention, using dry etching.
Figure 14B:
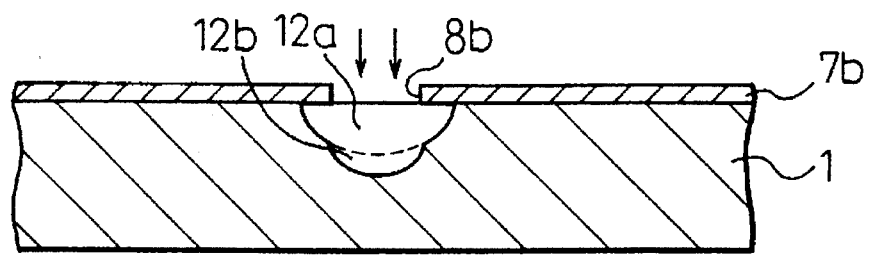
Figure 14C:
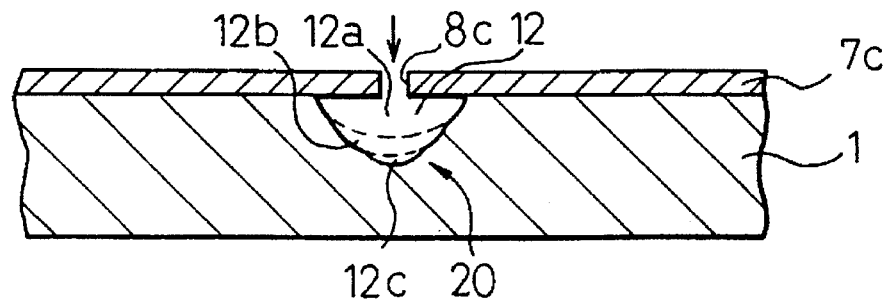

FIGS. 14A to 14C show the second embodiment of the present invention. This embodiment uses dry etching for forming the cavities 12, in place of anisotropic etching in the previous embodiment. Dry etching is carried out, using a mask 7a having apertures 8a corresponding to the outer shape of cavities 12 to be formed, as shown in FIG. 14A. Second dry etching is carried out, using a mask 7b having apertures 8b which are smaller than the apertures 8a, as shown in FIG. 14B. Third dry etching is carried out, using a mask 7c having apertures 8c which are smaller than the apertures 8b, as shown in FIG. 14C. In this way, a plurality of (not limited to three) dry etchings are repeated, using masks 7a to 7c having progressively smaller apertures 8a to 8c, so that wedge-shaped cavities 12 are formed. Also, the present invention is not limited to the illustrated etchings, but it is possible to use any etching technique to obtain wedge-shaped cavities.

We claim:

1. A method for fabricating a semiconductor device, said method comprising the steps of:
preparing a plate having a flat surface, a <110> crystallographic plane, and a <1-11> crystallographic plane, said flat surface being in the <110> crystallographic plane;
forming a plurality of cavities on the flat surface of the plate by etching, using a mask having apertures in the shape of a parallelogram arranged such that one side of the parallelogram is generally parallel to the <1-11> crystallographic plane;
filling the cavities with a solder paste;
heating the plate to form solder balls in the cavities; and
transferring the solder balls from the plate to a first member onto which solder bumps are to be formed.

2. A method for fabricating a semiconductor device according to claim 1, wherein the first member comprises one of a semiconductor chip, an IC chip, a semiconductor package, a printed wiring board, and a TAB member.

3. A method for fabricating a semiconductor device according to claim 1, wherein the mask has apertures in the shape of a rhombus.

4. A method for fabricating a semiconductor device according to claim 1, wherein the plate comprises a silicon plate.

5. A method for fabricating a semiconductor device according to claim 1, wherein the plate is covered by a protective layer.

6. A method for fabricating a semiconductor device according to claim 5, wherein the protective layer comprises an oxide layer.

7. A method for fabricating a semiconductor device according to claim 5, wherein the protective layer comprises a nitride layer.

8. A method for fabricating a semiconductor device according to claim 1, wherein the step of etching is carried out by dry etching.

9. A method for fabricating a semiconductor device according to claim 1, wherein the step of etching is carried out by anisotropy etching.

10. A method for fabricating a semiconductor device according to claim 1, wherein the step of heating is carried out while the plate is arranged in an inclined position relative to a horizontal.

11. A method for fabricating a semiconductor device according to claim 1, wherein the step of filling the cavities is carried out after a nucleus material for forming a solder ball is provided at a position in each of the cavities.

12. A method for fabricating a semiconductor device, said method comprising the steps of:
preparing a plate having a flat surface;
forming a plurality of cavities on the flat surface of the plate;
filling the cavities with a solder paste;
heating the plate to form solder balls in the cavities while the plate is arranged in an inclined position relative to a horizontal; and
transferring the solder balls from the plate to a first member onto which solder bumps are to be formed.

13. A method for fabricating a semiconductor device, said method comprising the steps of:
preparing a plate having a flat surface;
forming a plurality of cavities on the flat surface of the plate;
providing a nucleus material for forming a solder ball at a position in each of the cavities;
filling the cavities with a solder paste;
heating the plate to form solder balls in the cavities; and
transferring the solder balls from the plate to a first member onto which solder bumps are to be formed.

* * * * *